United States Patent
Ryu et al.

(10) Patent No.: US 11,544,957 B2
(45) Date of Patent: Jan. 3, 2023

(54) DISPLAY DEVICE

(71) Applicant: SAMSUNG DISPLAY CO., LTD., Yongin-si (KR)

(72) Inventors: Ji-Hun Ryu, Hwaseong-si (KR); Kwanghyun Baek, Asan-si (KR); Jongin Baek, Hwaseong-si (KR); Suyul Seo, Incheon (KR); Jaehyung Jo, Asan-si (KR); Sungho Jin, Yongin-si (KR)

(73) Assignee: SAMSUNG DISPLAY CO., LTD., Yongin-Si (KR)

(*) Notice: Subject to any disclaimer, the term of this patent is extended or adjusted under 35 U.S.C. 154(b) by 0 days.

(21) Appl. No.: 17/244,851

(22) Filed: Apr. 29, 2021

(65) Prior Publication Data
US 2022/0036032 A1 Feb. 3, 2022

(30) Foreign Application Priority Data
Jul. 30, 2020 (KR) .................. 10-2020-0095481

(51) Int. Cl.
*G06F 3/0482* (2013.01)
*G06V 40/13* (2022.01)
(Continued)

(52) U.S. Cl.
CPC ............ *G06V 40/1318* (2022.01); *G06T 7/11* (2017.01); *H01L 25/167* (2013.01); *H01L 25/18* (2013.01);
(Continued)

(58) Field of Classification Search
CPC ... G06V 40/1318; H01L 25/167; H01L 25/18; H01L 25/0753; H01L 27/32;
(Continued)

(56) References Cited

U.S. PATENT DOCUMENTS 10,152,087 B2 12/2018 Jung
10,452,106 B2 10/2019 Cho et al.
(Continued)

FOREIGN PATENT DOCUMENTS

KR 1020170061648 5/2017
KR 1020170140976 12/2017
(Continued)

*Primary Examiner* — Abdul-Samad A Adediran
(74) *Attorney, Agent, or Firm* — F. Chau & Associates, LLC

(57) ABSTRACT

A display device includes a display panel, an input sensor, and a control unit. The display panel includes a light blocking layer that includes an opening. The input sensor includes a first sensing element, a second sensing element, and a third sensing element. The control unit calculates a first distance between the first sensing element and the second sensing element when the display panel is in a first state and the second sensing element overlaps the opening, calculates a second distance between the first sensing element and a third sensing element when the display device is in a second state that differs from that of the first state and the third sensing element overlaps the opening, and corrects an image obtained from the input sensor on the basis of the first distance and the second distance.

20 Claims, 15 Drawing Sheets

(51) Int. Cl.
  *G06T 7/11*   (2017.01)
  *H01L 25/16*  (2006.01)
  *H01L 25/18*  (2006.01)
  H01L 25/075   (2006.01)
  H01L 27/32    (2006.01)

(52) U.S. Cl.
  CPC ............. *G06T 2207/20021* (2013.01); *H01L 25/0753* (2013.01); *H01L 27/32* (2013.01); *H01L 2251/5338* (2013.01)

(58) Field of Classification Search
  CPC ... H01L 2251/5338; G06T 2207/20021; G06F 1/1652; G09F 9/301; G09G 5/00
  USPC .......................................................... 345/173
  See application file for complete search history.

(56) References Cited

U.S. PATENT DOCUMENTS

| | | | |
|---|---|---|---|
| 10,482,304 B2 | 11/2019 | Zhang | |
| 10,514,792 B2 | 12/2019 | Kim | |
| 2015/0348453 A1* | 12/2015 | Jin | G09F 9/301 345/173 |
| 2017/0249494 A1 | 3/2017 | Zhang et al. | |
| 2018/0039387 A1* | 2/2018 | Cheong | G06F 1/1652 |
| 2019/0286320 A1* | 9/2019 | Han | G09G 5/00 |
| 2020/0104662 A1 | 4/2020 | Sung et al. | |

FOREIGN PATENT DOCUMENTS

| | | |
|---|---|---|
| KR | 1020180064631 | 6/2018 |
| KR | 1020200038388 | 4/2020 |

\* cited by examiner

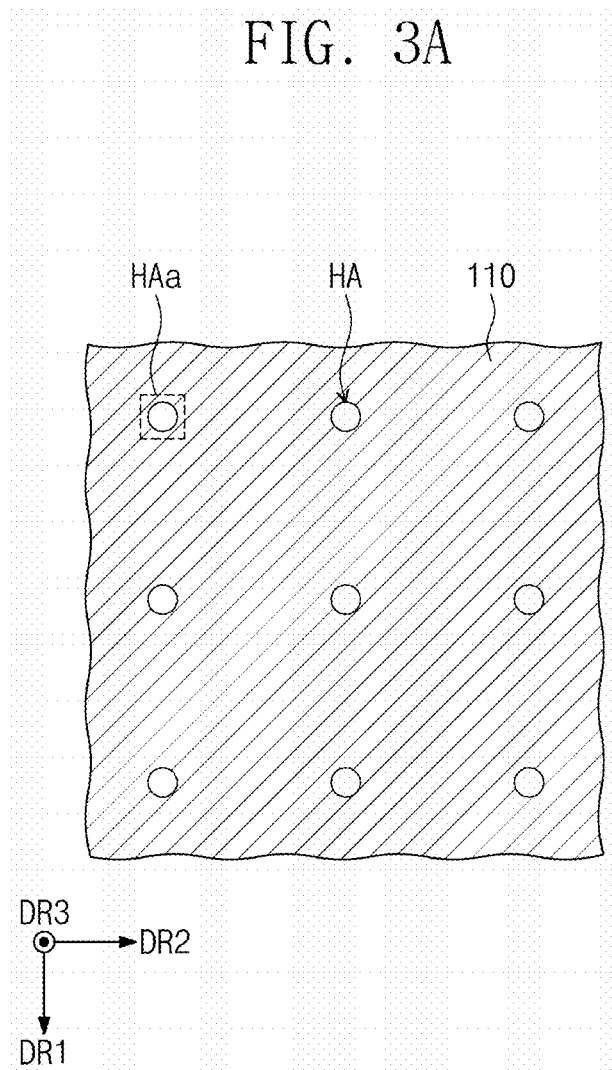

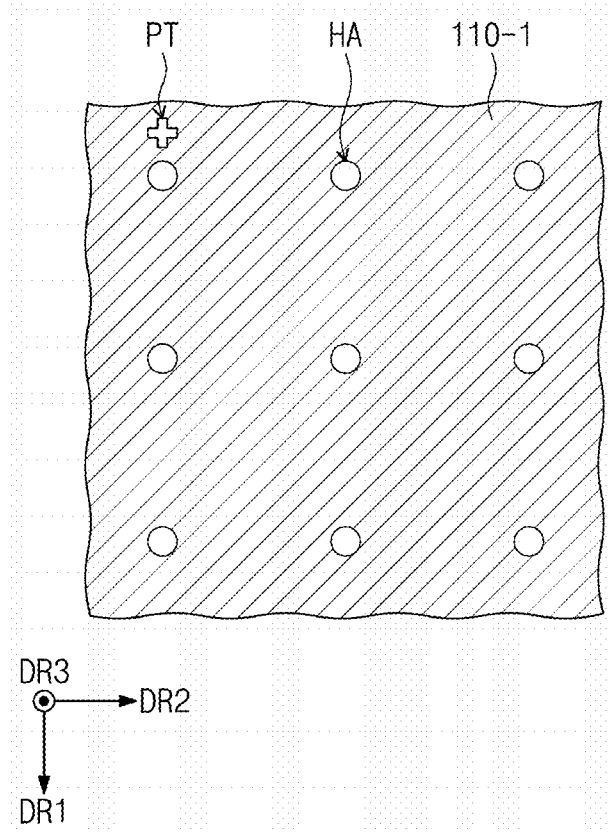

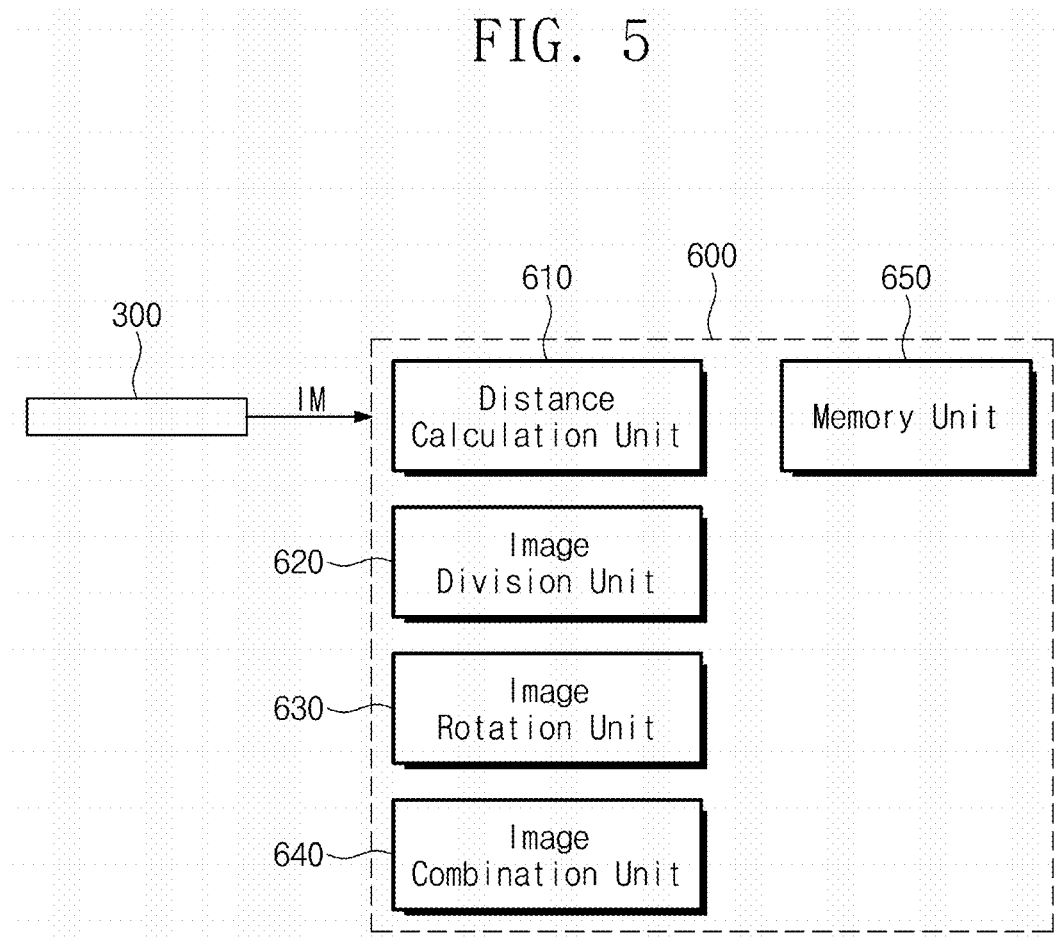

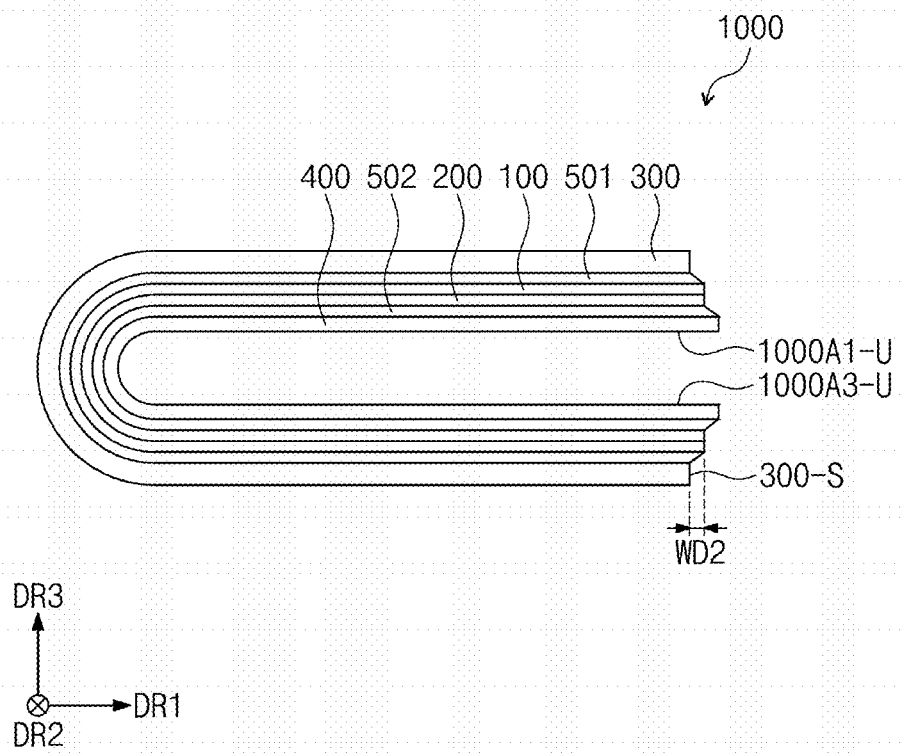

DISPLAY DEVICE

CROSS-REFERENCE TO RELATED APPLICATIONS

This U.S. non-provisional patent application claims priority under 35 U.S.C. § 119 from Korean Patent Application No. 10-2020-0095481, filed on Jul. 30, 2020 in the Korean Intellectual Property Office, the contents of which are herein incorporated by reference in their entirety.

TECHNICAL FIELD

Embodiments of the present disclosure are directed to a display device with improved fingerprint recognition performance.

DISCUSSION OF THE RELATED ART

A display device provides a variety of functions for allowing communication with a user, such as displaying an image to provide information to the user or sensing a user input. Many recent display devices include a function for sensing a user's fingerprint. Methods for recognizing a fingerprint include a capacitance method which senses capacitance change formed between electrodes, an optical method which senses light incident using an optical sensor, or a ultrasonic method which senses vibration using a piezoelectric body, etc. In many recent display devices, an input sensor that recognizes a fingerprint may be disposed on the back surface of a display panel.

SUMMARY

Embodiments of the present disclosure provide a display device with improved fingerprint recognition performance.

An embodiment of the inventive concept provides a display device that includes a display panel, an input sensor, and a control unit. The display panel is divided into a folding region and a non-folding region and includes a display element layer above a light blocking layer, wherein the light blocking layer includes an opening formed therein. The input sensor is disposed under the light blocking layer of the display panel, overlaps the non-folding region, and includes a first sensing element, a second sensing element, and a third sensing element. The control unit calculates a first distance between the first sensing element and the second sensing element when the display panel is in a first state and the second sensing element overlaps the opening, calculates a second distance between the first sensing element and a third sensing element when the display device is in a second state that differs from that of the first state and the third sensing element overlaps the opening, and corrects an image obtained from the input sensor based on the first distance and the second distance.

In an embodiment, the first sensing element is disposed adjacent to an edge of the input sensor.

In an embodiment, the first state is when the display panel is unfolded, the second state is when the display panel is folded, and the image is obtained by the input sensor in the second state.

In an embodiment, a plurality of holes are formed in the light blocking layer, and the plurality of holes and the opening have a same shape.

In an embodiment, a plurality of holes are formed in the light blocking layer, and the opening has a shape that differs from a shape of each of the plurality of holes.

In an embodiment, the first sensing element, the second sensing element, and the third sensing element may be spaced apart in a first direction.

In an embodiment, the control unit divides the image into a plurality of sub-images based on a difference between the first distance and the second distance, rotates each of the plurality of sub-images into a plurality of rotated sub-images, respectively, combines the plurality of rotated sub-images, and provides a fingerprint image.

In an embodiment, the control unit stores a difference between the first distance and the second distance, and divides the image into a plurality of sub-images using the difference when the display panel is in the second state.

In an embodiment, the control unit divides the image into a plurality of sub-images using a cutting line calculated based on a difference between the first distance and the second distance and obtains fingerprint information when the display panel is in the second state.

In an embodiment of the inventive concept, a display device includes a display panel, an input sensor, and a control unit. The display panel includes a display element layer, and a light blocking layer disposed under the display element layer and that includes an opening formed therein. The display panel is divided into folding region and a non-folding region. The input sensor is disposed under the non-folding region of the display panel and includes a plurality of sensing elements. The control unit divides a first image obtained from the input sensor into a plurality of first sub-images using a first cutting line and obtains fingerprint information when the display panel is unfolded, and divides a second image obtained from the input sensor into a plurality of second sub-images using a second cutting line in a different position from the first cutting line and obtains fingerprint information when the display panel is folded.

In an embodiment, the plurality of sensing elements include a first sensing element disposed adjacent to an edge of the input sensor, a second sensing element that overlaps the opening when the display panel is unfolded, and a third sensing element that overlaps the opening when the display panel is folded.

In an embodiment, the first sensing element, the second sensing element, and the third sensing element are spaced apart in a first direction.

In an embodiment, the control unit calculates a first distance between the first sensing element and the second sensing element, and calculates a second distance between the first sensing element and the third sensing element.

In an embodiment, the second cutting line is obtained by moving the first cutting line by a distance that corresponds to difference value between the first distance and the second distance.

In an embodiment, the control unit stores the difference value, determines the second cutting line using the difference when the display panel is folded, and divides the second image based on the second cutting line.

In an embodiment, the control unit rotates each of the plurality of second sub-images, combines the plurality of rotated second sub-images into a fingerprint image, and provides the fingerprint image.

In an embodiment, a plurality of holes are formed in the light blocking layer, and the plurality of holes and the opening have a same shape.

In an embodiment, a plurality of holes are formed in the light blocking layer, and the opening has a shape that differs from a shape of each of the plurality of holes.

In an embodiment of the inventive concept, a display device a display panel, an input sensing layer, and a control unit. The display panel is divided into a folding region and a non-folding region and includes a light blocking layer that includes a plurality of openings. The input sensor is disposed under the non-folding region of the display panel, and includes a first sensing element, a second sensing element that overlaps an opening of the plurality of openings when the display panel is unfolded, and a third sensing element that overlaps the opening of the plurality of openings when the display panel is partially folded. The control unit includes a distance calculation unit, an image division unit, an image rotation unit and an image combination unit. When a first image is obtained by the input sensor when the display panel is unfolded, the distance calculation unit calculates a first distance between the first sensing element and the second sensing element, the image division unit divides the first image into a plurality of first sub-images using a first cutting line, the image rotation unit rotates each of the plurality of sub-images to form a plurality of rotation images, and the image combination unit extracts the information for obtaining fingerprint information by deleting unnecessary image portions from the plurality of rotation images and forms a plurality of partial images and combines the plurality of partial images into a fingerprint image.

In an embodiment, when a second image is obtained by the second input sensor when the display panel is at least partially folded, the distance calculation unit calculates a second distance between the first sensing element and the third sensing element and a difference value between the first distance and the second distance, and the image division unit divides the second image using a second cutting line calculated from the difference value between the first distance and the second distance.

BRIEF DESCRIPTION OF THE FIGURES

FIG. 3A is a plan view of a portion of a light blocking layer according to an embodiment of the inventive concept.

FIG. 3B is a plan view of a portion of a light blocking layer according to an embodiment of the inventive concept.

FIG. 5 illustrates a second input sensor and a control unit according to an embodiment of the inventive concept.

FIG. 9 is a cross-sectional view of a display device according to an embodiment of the inventive concept.

DETAILED DESCRIPTION

Figure 1A:
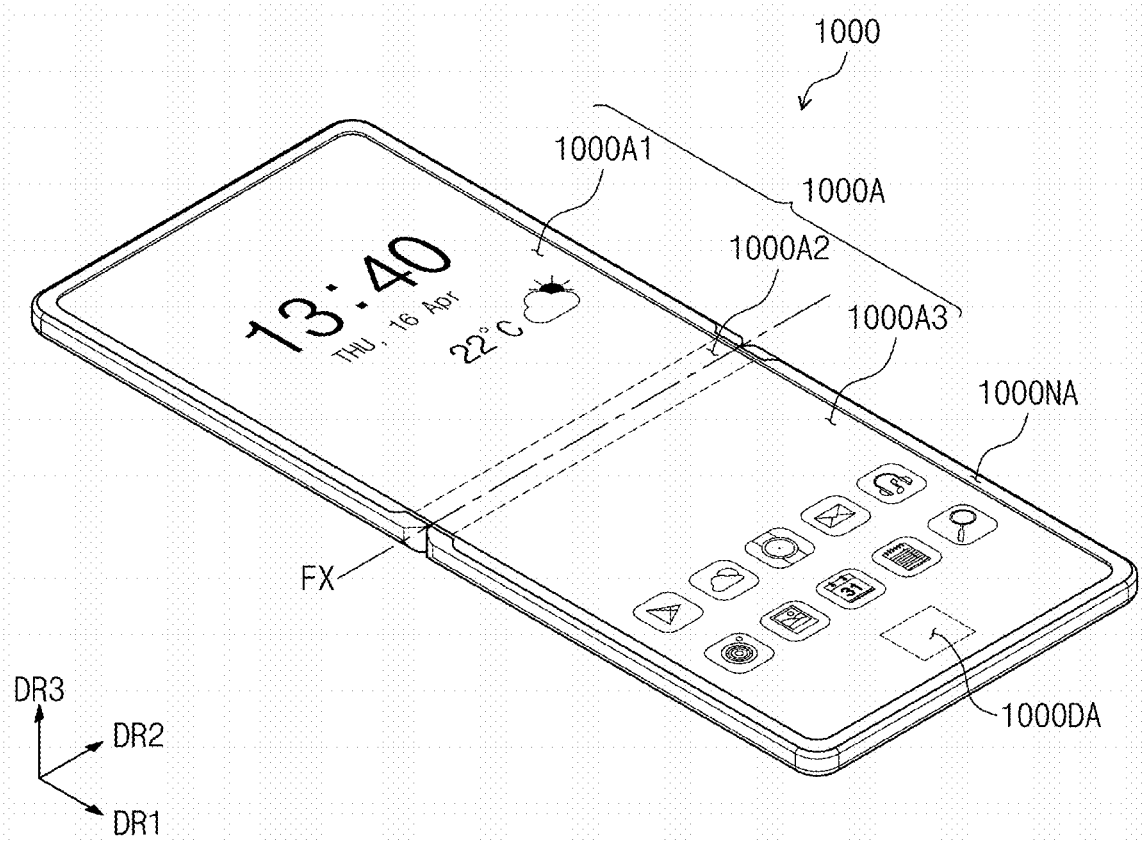
FIG. 1A and FIG. IB are perspective views of a display device according to an embodiment of the inventive concept.

In the present disclosure, when an element, or a region, a layer, a portion, etc., is referred to as being "on," "connected to," or "coupled to" another element, it means that the element may be directly disposed on/connected to/coupled to the other element, or that a third element may be disposed therebetween.

Like reference numerals may refer to like elements. Also, in the drawings, the thickness, the ratio, and the dimensions of elements may be exaggerated for an effective description of technical contents.

Hereinafter, embodiments of the inventive concept will be described with reference to the accompanying drawings.

Figure 1B:
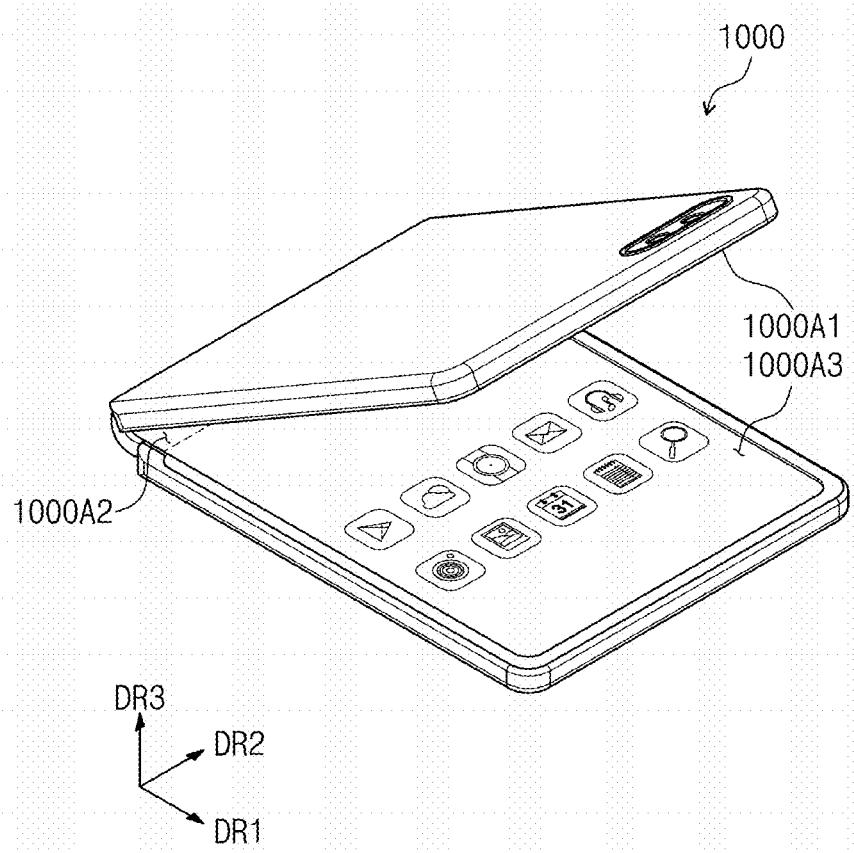

FIG. 1A is a perspective view of a display device according to an embodiment of the inventive concept, and FIG. 1B is a perspective view of a display device according to an embodiment of the inventive concept. FIG. 1A illustrates a display device 1000 in an unfolded state, and FIG. 1B illustrates the display device 1000 in a folded state.

Referring to FIG. 1A and FIG. 1B, according to an embodiment, the display device 1000 can be activated by an electrical signal. For example, the display device 1000 may be a mobile phone, a tablet computer, a car navigation system unit, a game console, or a wearable device, but embodiments are not limited thereto. In FIG. 1A, the display device 1000 is illustrated as a mobile phone.

The display device 1000 displays an image through an active region 1000A. When the display device 1000 is unfolded, the active region 1000A forms a plane defined by a first direction DR1 and a second direction DR2 that crosses the first direction. The thickness direction of the display device 1000 is parallel to a third direction DR3 that is normal to the plane defined by the first direction DR1 and the second direction DR2. Therefore, as front surface or an upper surface, and a rear surface or a lower surface of the display device 1000 are defined on the basis of the third direction DR3.

According to an embodiment, the active region 1000A includes a first region 1000A1, a second region 1000A2, and a third region 1000A3. The second region 1000A2 can be bent about a folding axis FX that extends along the second direction DR2. Therefore, the first region 1000A1 and the third region 1000A3 are referred to as non-folding regions, and the second region 1000A2 may be referred to as a folding region.

In the active region 1000A, according to an embodiment, a sensing region 1000DA is provided. The display device 1000 can sense a user's fingerprint in the sensing region 1000DA. FIG. 1A illustrates that the sensing region 1000DA corresponds to some regions of the active region 1000A, but embodiments of the inventive concept are not limited thereto. In other embodiments, the sensing region 1000DA corresponds to the entire region of the active region 1000A.

According to an embodiment, when the display device 1000 is folded, the first region 1000A1 and the third region 1000A3 face each other. Therefore, in a completely folded state, the active region 1000A is not externally exposed, a condition that is referred to as in-folding. However, embodiments are not limited thereto, and the operation of the display device 1000 is not limited thereto.

For example, in an embodiment of the inventive concept, when the display device 1000 is folded, the first region 1000A1 and the third region 1000A3 oppose each other. Therefore, in a folded state, the active region 1000A is externally exposed, a condition that is referred to as out-folding.

According to an embodiment, the display device 1000 may perform either an in-folding operation or an out-folding operation. According to an embodiment, the display device 1000 performs both the in-folding operation and the out-folding operation. In this case, the same region of the display device 1000, for example, the second region 1000A2, can be in-folded or out-folded. According to an embodiment, some regions of the display device 1000 are in-folded, and other regions thereof are out-folded.

In FIG. 1A and FIG. 1B, in an embodiment, one folding region and two non-folding regions are illustrated. However, the number of folding regions and non-folding regions according to embodiments of the inventive concept are not limited thereto. For example, in other embodiments, the display device 1000 includes a plurality of more than two non-folding regions and a plurality of folding regions disposed between adjacent non-folding regions.

According to an embodiment, a peripheral region 1000NA surrounds the active region 1000A. However, embodiments of the inventive concept are not limited thereto. The shape of the active region 1000A and the shape of the peripheral region 1000NA are correlated. No image is displayed in the peripheral region 1000NA.

In FIG. 1A and FIG. 1B, according to an embodiment, the folding axis FX is illustrated as being parallel to a short axis of the display device 1000, but embodiments of the inventive concept are not limited thereto. According to an embodiment, the folding axis FX extends along a long axis of the display device 1000, such as a direction parallel to the first direction DR1. In this case, the first region 1000A1, the second region 1000A2, and the third region 1000A3 are sequentially arranged along the second direction DR2.

Figure 2:
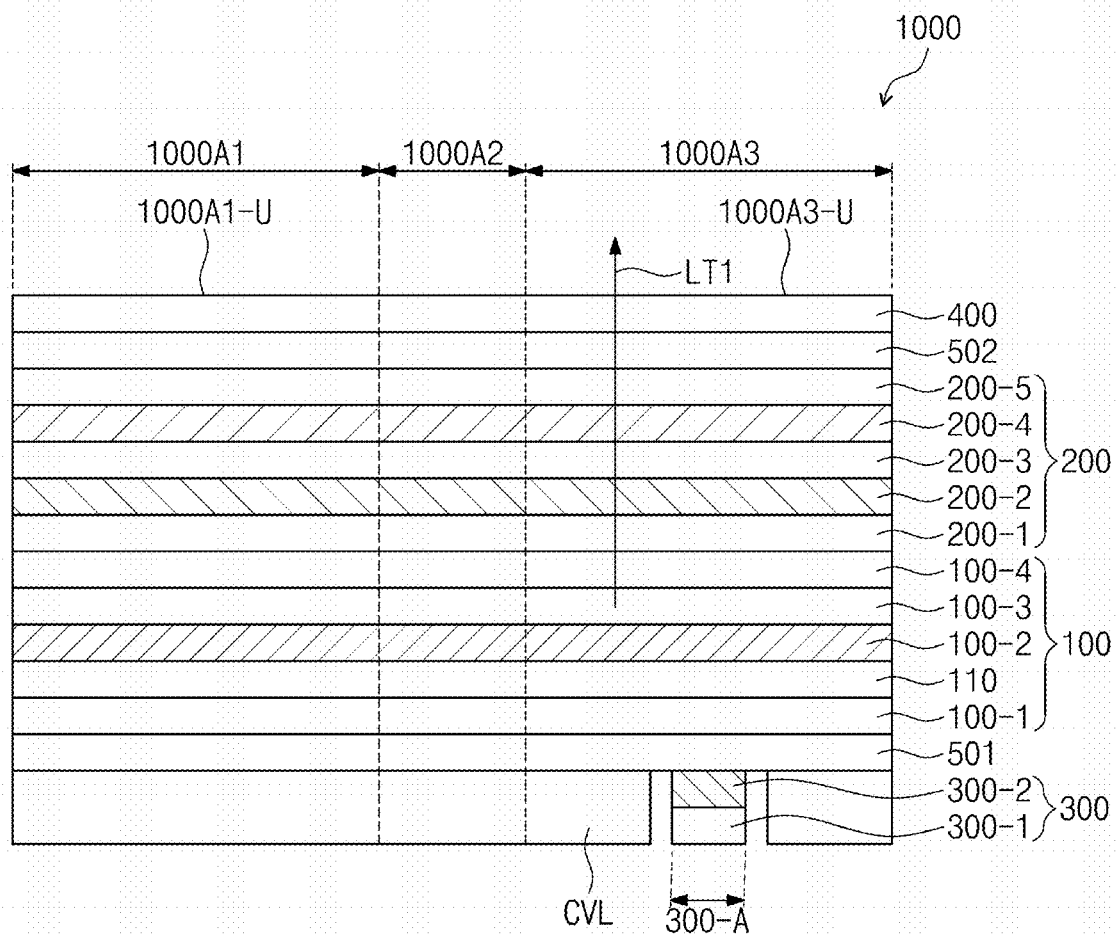
FIG. 2 is a cross-sectional view of a display device according to an embodiment of the inventive concept.

FIG. 2 is a cross-sectional view of a display device according to an embodiment of the inventive concept.

Referring to FIG. 2, according to an embodiment, the display device 1000 includes a display panel 100, a first input sensor 200, a second input sensor 300, a cover layer CVL, and a window 400.

According to an embodiment, the display panel 100 generates an image. The display panel 100 includes a display region and a non-display region. The display region of the display panel 100 corresponds to the active region 1000A of the display device 1000 shown in FIG. 1A, and the non-display region of the display panel 100 correspond to the peripheral region 1000NA of the display device 1000 shown in FIG. 1A.

According to an embodiment, the display panel 100 includes a folding region and non-folding regions. The folding region corresponds to the second region 1000A2 of the display device 1000, and the non-folding regions correspond to the first region 1000A1 and the third region 1000A3.

In FIG. 2, the display panel 100 is in a first state. The first state is when the display panel 100 is unfolded.

According to an embodiment, the display panel 100 includes a base layer 100-1, a light blocking layer 110, a circuit layer 100-2, a display element layer 100-3, and an encapsulation layer 100-4.

According to an embodiment, the base layer 100-1 is at least one of a silicon substrate, a plastic substrate, a glass substrate, an insulation film, or a laminated structural body that includes a plurality of insulation layers.

According to an embodiment, the light blocking layer 110 is disposed on the base layer 100-1. However, embodiments are not limited thereto. As long as the light blocking layer 110 according to an embodiment of the inventive concept is disposed between the display element layer 100-3 and the second input sensor 300, the position of the light blocking layer 110 can vary. In an embodiment, the light blocking layer 110 is directly formed on the lower surface of the base layer 100-1. In an embodiment, the light blocking layer 110 is bonded to the lower surface of the base layer 100-1 through an adhesive layer. The light blocking layer 110 overlaps the second input sensor 300.

According to an embodiment, the circuit layer 100-2 is disposed on the base layer 100-1. The circuit layer 100-2 includes a plurality of insulation layers, a plurality of conductive layers, and a semiconductor layer. The plurality of conductive layers of the circuit layer 100-2 constitute a control circuit of signal lines or pixels.

According to an embodiment, the display element layer 100-3 is disposed on the circuit layer 100-2. The display element layer 100-3 is a light emitting display layer, but embodiments are not limited thereto. For example, the display element layer 100-3 may be one of an organic light emitting display layer, a quantum-dot display layer, a nano-LED display layer, or a micro-LED display layer. An organic light emitting display layer includes an organic light emitting material. A quantum-dot display layer includes a quantum dot, a quantum load, etc. A nano-LED display layer and a micro-LED display layer each include a small LED element whose size is equal to or less than several hundred micrometers.

According to an embodiment, the display element layer 100-3 emits a first light LT1 in a direction toward the first input sensor 200. Light from the display element layer 100-3 passes through the first input sensor 200 and the window 400 to the outside.

According to an embodiment, the encapsulation layer 100-4 is disposed on the display element layer 100-3 and covers the display element layer 100-3. The encapsulation layer 100-4 includes a first inorganic layer, an organic layer, and a second inorganic layer sequentially stacked along the third direction DR3. However, embodiments of the encapsulation layer 100-4 are not limited thereto. In an embodiment, the encapsulation layer 100-4 further includes a plurality of inorganic layers and a plurality of organic layers. In an embodiment, the encapsulation layer 100-4 is composed of a single layer.

According to an embodiment, the first inorganic layer can prevent external moisture or oxygen from penetrating into the display element layer 100-3. The first inorganic layer includes at least one of silicon nitride, silicon oxide, or a compound thereof.

According to an embodiment, the organic layer is disposed on the first inorganic layer and provides a flat surface. Bumps that may be formed on an upper surface of the first inorganic layer, or particles that may be present on the first inorganic layer are covered by the organic layer. The organic layer includes an acrylic organic layer, but embodiments are not limited thereto.

According to an embodiment, the second inorganic layer is disposed on the organic layer and covers the organic layer. The second inorganic layer encapsulates moisture, etc., discharged from the organic layer and prevents the moisture from escaping. The second inorganic layer includes at least one of silicon nitride, silicon oxide, or a compound thereof.

According to an embodiment, the first input sensor 200 is disposed on the display panel 100. The first input sensor 200 can sense an external input received from the outside. The external input may be a user input. The user input may be one or more of various forms of external inputs, such as a part of a user's body, light, heat, a pen, or pressure.

According to an embodiment, the first input sensor 200 is disposed on the display panel 100 through a series of processes. According to an embodiment, the first input sensor 200 and the display panel 100 are coupled to each other through an adhesive member. For example, the adhesive member is at least one transparent adhesive member such as a pressure sensitive adhesive (PSA) film, an optically clear adhesive (OCA) film, or an optically clear resin (OCR).

According to an embodiment, the first input sensor 200 includes a base insulation layer 200-1, a first conductive layer 200-2, a sensing insulation layer 200-3, a second conductive layer 200-4, and a cover insulation layer 200-5.

According to an embodiment, the base insulation layer 200-1 is an inorganic layer that includes any one of silicon nitride, silicon oxynitride, or silicon oxide. According to an embodiment, the base insulation layer 200-1 is an organic layer that includes an epoxy resin, an acrylic resin, or an imide-based resin. The base insulation layer 200-1 may have a single-layered structure, or a laminate structure in which a plurality of layers are stacked along the third direction DR3.

According to an embodiment, the base insulation layer 200-1 is disposed directly on the display panel 100. According to an embodiment, the base insulation layer 200-1 is one component of the display panel 100. According to an embodiment, the base insulation layer 200-1 is provided on a separate base layer and the base layer and the display panel 100 are coupled to each other by an adhesive member.

According to an embodiment, the first conductive layer 200-2 is disposed on the base insulation layer 200-1. The sensing insulation layer 200-3 is disposed on the first conductive layer 200-2. The second conductive layer 200-4 is disposed on the sensing insulation layer 200-3. The cover insulation layer 200-5 is disposed on the second conductive layer 200-4.

According to an embodiment, each of the first conductive layer 200-2 and the second conductive layer 200-4 may have a single-layered structure or a multi-layered structure in which a plurality of layers are stacked along the third direction DR3. A single-layered conductive layer includes a metal layer or a transparent conductive layer. The metal layer includes at least one of molybdenum, silver, titanium, copper, aluminum, or an alloy thereof. The transparent conductive layer includes at least one transparent conductive oxide such as indium tin oxide (ITO), indium zinc oxide (IZO), zinc oxide (ZnO), or indium zinc tin oxide (IZTO), etc. In addition, the transparent conductive layer may include a conductive polymer such as PEDOT, a metal nanowire, graphene, etc.

According to an embodiment, a multi-layered conductive layer includes metal layers. The metal layers may have, for example, a three-layered structure of titanium/aluminum/titanium. The conductive layer of a multi-layered structure includes at least one metal layer or at least one transparent conductive layer.

According to an embodiment, each of the first conductive layer 200-2 and the second conductive layer 200-4 includes at least some first sensing electrodes and second sensing electrodes. The first input sensor 200 obtains information on an external input through a change in mutual capacitance between the first sensing electrodes and the second sensing electrodes. According to an embodiment, at least one of the sensing insulation layer 200-3 or the cover insulation layer 200-5 includes an inorganic film. The inorganic film includes at least one of aluminum oxide, titanium oxide, silicon oxide, silicon oxynitride, zirconium oxide, or hafnium oxide.

According to an embodiment, at least one of the sensing insulation layer 200-3 or the cover insulation layer 200-5 includes an organic film. The organic film includes at least one of an acrylic resin, a methacryl-based resin, polyisoprene, a vinyl-based resin, an epoxy-based resin, a urethane-based resin, a cellulose-based resin, a siloxane-based resin, a polyimide-based resin, a polyamide-based resin, or a perylene-based resin.

According to an embodiment, the second input sensor 300 is disposed under the display panel 100. The first input sensor 300 can sense a user's biometric authentication information received from the outside. For example, the biometric authentication information may be a fingerprint. The second input sensor 300 senses a surface of a touch object. The surface may be a substantially uniform surface or a bumpy surface. For example, the surface may include user's fingerprint information. The second input sensor 300 may be referred to as a fingerprint sensing panel, a fingerprint sensing element, a fingerprint sensing module, a fingerprint sensing layer, or an input sensor 300.

According to an embodiment, the second input sensor 300 includes a sensing region 300-A. The sensing region 300-A overlaps the sensing region 1000DA of the display device 1000. The second input sensor 300 includes a plurality of sensing elements that can sense a fingerprint, such as a plurality of photodiodes.

According to an embodiment, the second input sensor 300 includes a base layer 300-1 and a biometric information sensing layer 300-2.

According to an embodiment, the base layer 300-1 includes a synthetic resin layer. The synthetic resin layer includes a thermosetting resin. For example, the synthetic resin layer is a polyimide-based resin layer, although embodiments of the material are not limited thereto. According to an embodiment, the base layer 300-1 includes two layers of polyimide-based resin layers and a barrier layer disposed between the polyimide-based resin layers. The barrier layer includes amorphous silicon or a silicon oxide.

According to an embodiment, the biometric information sensing layer 300-2 is disposed on the base layer 300-1, between the base layer 300-1 and the display panel 100. The biometric information sensing layer 300-2 includes a sensing circuit and insulation layers. The sensing circuit includes at least one transistor and at least one photodiode. However, embodiments are not limited thereto. According to an embodiment, the second input sensor 300 includes an image sensor. For example, the second input sensor 300 may be a CMOS image sensor or a CCD image sensor.

According to an embodiment, the second input sensor 300 is disposed under the display panel 100. The second input sensor 300 may be bonded to the display panel 100, or may not be bonded to the display panel 100. FIG. 2 shows the second input sensor 300 as being a unit part or module, embodiments of the second input sensor 300 are not limited thereto. According to an embodiment, the second input sensor 300 is bonded to the entire surface of the display panel 100 to sense externally received user biometric authentication information.

According to an embodiment, cover layer CVL is disposed under the display panel 100. The cover layer CVL adsorbs external impacts and protects the display panel 100. The cover layer CVL does not overlap the second input sensor 300. The cover layer CVL includes at least one of an embossed layer, a cushion layer, a light absorbing layer, an electromagnetic wave shielding layer, or a heat dissipating layer. The embossed layer absorbs light incident on the cover layer CVL. The cushion layer includes at least one of a sponge, foam, or a urethane resin. The heat dissipating layer includes a thermally conductive material.

According to an embodiment, FIG. 2 shows the cover layer CVL as overlapping the first region 1000A1 and the second region 1000A2. However, embodiments of the cover layer CVL are not limited thereto. In an embodiment, a portion of the cover layer CVL that overlaps the second region 1000A2 is removed, and thus, the cover layer CVL does not overlap the second region 1000A2.

According to an embodiment, the window 400 is disposed on the first input sensor 200. The window 400 includes an optically transparent insulation material. For example, the window 400 includes at least one of glass or plastic. The window 400 may have a multi-layered structure or a single-layered structure. For example, the window 400 may include a plurality of plastic films coupled to each other with an adhesive, or a glass substrate and a plastic film coupled to each other with an adhesive.

According to an embodiment, a first adhesive layer 501 is disposed between the display panel 100 and the second input sensor 300. A second adhesive layer 502 is disposed between the window 400 and the first input sensor 200. Each of the first adhesive layer 501 and the second adhesive layer 502 includes a typical adhesive or a typical pressure-sensitive adhesive. For example, each of the first adhesive layer 501 and the second adhesive layer 502 is a transparent adhesive member such as a pressure sensitive adhesive (PSA) film, an optically clear adhesive (OCA) film, or an optically clear resin (OCR).

According to an embodiment, each of the first adhesive layer 501 and the second adhesive layer 502 include a low Modulus material. When the display device 1000 is folded, the shape of each of the first adhesive layer 501 and the second adhesive layer 502 changes. When the display device 1000 is folded, the shapes of the first adhesive layer 501 and the second adhesive layer 502 relieve stress applied to the display panel 100 and the first input sensor 200.

FIG. 3A is a plan view of a portion of a light blocking layer according to an embodiment of the inventive concept.

Referring to FIG. 2 and FIG. 3A, according to an embodiment, the light blocking layer 110 absorbs light. The light blocking layer 110 includes a plurality of openings HA. The plurality of openings HA may be referred to as a plurality of holes HA. The plurality of openings HA are spaced apart in the first direction DR1 and the second direction DR2. For example, the plurality of openings HA are arranged in a matrix shape. FIG. 3A illustrates 9 openings HA, however, embodiments are not limited to the number openings HA shown in FIG. 3A.

According to an embodiment, each of the plurality of openings HA has the same shape as each other. In an embodiment, each of the plurality of openings HA has a circular shape. However, embodiments are not limited thereto. In an embodiment of the inventive concept, each of the plurality of openings HA may have, for example, a polygonal shape.

According to an embodiment, one opening HAa of the plurality of openings HA is selected as a reference opening HAa. On a plane, the reference opening HAa is disposed adjacent to an edge of the second input sensor 300. According to an embodiment, the display device 1000 includes a control unit 600, shown in FIG. 5. When the display device is in an unfolded state, the control unit 600 calculates a first distance between a first sensing element of the second input sensor 300 that is adjacent to an edge of the second input sensor 300 and a second sensing element that overlaps the reference opening HAa, and when the display device is in a folded state, calculates a second distance between the first sensing element and a third sensing element that overlaps the reference opening HAa. The control unit 600 corrects an image obtained from the second input sensor 300 on the basis of the first distance and the second distance. The control unit 600 obtains fingerprint information by revising an image obtained when the display device 1000 is in a folded state. Therefore, the display device 1000 according to an embodiment has improved fingerprint recognition performance. The operation of the control unit 600 will be described in detail below.

FIG. 3B is a plan view of a portion of a light blocking layer according to an embodiment of the inventive concept. In describing FIG. 3B, the same reference numerals are given to components described with reference to FIG. 3A, and repeated descriptions thereof are omitted.

Referring to FIG. 3B, according to an embodiment, a light blocking layer 110-1 includes a plurality of holes HA and an opening PT. The opening PT may be referred to as a pattern PT.

Figure 4:
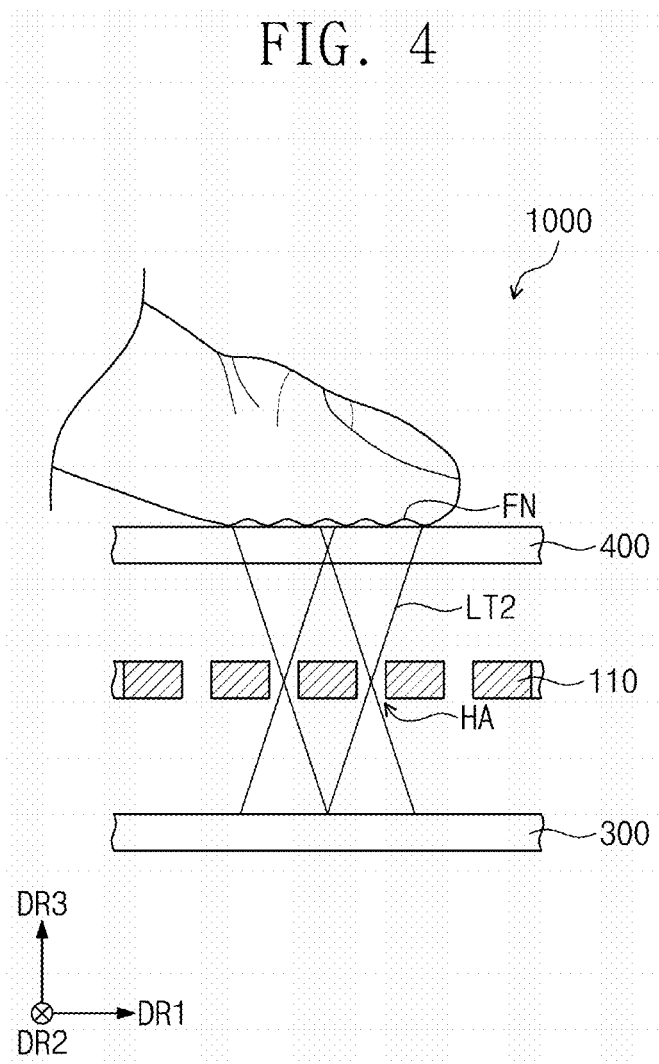
FIG. 4 is a cross-sectional view of a display device according to an embodiment of the inventive concept.

According to an embodiment, the plurality of holes HA and the opening PT have different shapes. The opening PT may have a cross shape, however, embodiments are not limited thereto. According to embodiments, the opening PT may have a triangular shape or a rectangular shape, and the shape of the opening PT is not limited as long as it can be distinguished from the plurality of holes HA. FIG. 4 is a cross-sectional view of a display device according to an embodiment of the inventive concept.

Referring to FIG. 2 and FIG. 4, according to an embodiment, the light blocking layer 110 is disposed between the window 400 and the second input sensor 300. The light blocking layer 110 filters light incident on the second input sensor 300. The light blocking layer 110 includes the plurality of openings HA. Each of the plurality of openings HA has a size less than or equal to a predetermined size. Each of the plurality of openings HA may be referred to as a pin hole HA.

According to an embodiment, the window 400 can be contacted by a part of a user's body. For example, the part of a body may be a fingerprint FN of a finger. The first light LT1 provided to the window 400 is reflected from the fingerprint FN. The reflected first light LT1 may be referred to as a second light LT2.

According to an embodiment, the second light LT2 passes through the plurality of openings HA to be incident to the second input sensor 300. The plurality of openings HA form a focal point of the second light LT2 transmitted between the window 400 and the second input sensor 300. The second input sensor 300 obtains an image through the second light LT2.

According to an embodiment, the second input sensor 300 is an optical sensor which can recognize the fingerprint FN by sensing the second light LT2 reflected by ridges of the fingerprint FN and valleys between ridges.

According to an embodiment, the incident angle of the second light LT2 is controlled by the size of each of the plurality of openings HA and the thickness of the light blocking layer 110. According to an embodiment, only second light LT2 incident at a predetermined incident angle or less is incident onto the second input sensor 300 from the light blocking layer 110 in the display panel 100. A first partial image is obtained in the second input sensor 300 by sensing the second light LT2 through one opening HA, and a second partial image is obtained in the second input sensor 300 by sensing the second light LT2 through an adjacent opening HA. The first partial image and the second partial image do not overlap when viewed on a plane. In the second input sensor 300, partial images obtained by sensing the second light LT2 through the plurality of openings HA can be sensed as a single image since the partial images do not overlap each other. Therefore, the accuracy or sensitivity of fingerprint recognition is improved.

FIG. 5 illustrates a second input sensor and a control unit according to an embodiment of the inventive concept.

Referring to FIG. 5, according to an embodiment, the second input sensor 300 provides an image IM to the control unit 600. The control unit 600 corrects the image IM and obtains fingerprint information. The control unit 600 includes a distance calculation unit 610, an image division unit 620, an image rotation unit 630, an image combination unit 640, and a memory unit 650.

The names of the distance calculation unit 610, the image division unit 620, the image rotation unit 630, the image combination unit 640, and the memory unit 650 correspond to the respective operations of the components. Therefore, the distance calculation unit 610, the image division unit 620, the image rotation unit 630, the image combination unit 640, and the memory unit 650 may be implemented in a single chip, or one or more of the distance calculation unit 610, the image division unit 620, the image rotation unit 630, the image combination unit 640, and the memory unit 650 may be implemented in different chips.

According to an embodiment, each of the distance calculation unit 610, the image division unit 620, the image rotation unit 630, the image combination unit 640, and the memory unit 650 will be described below.

Figure 6A:
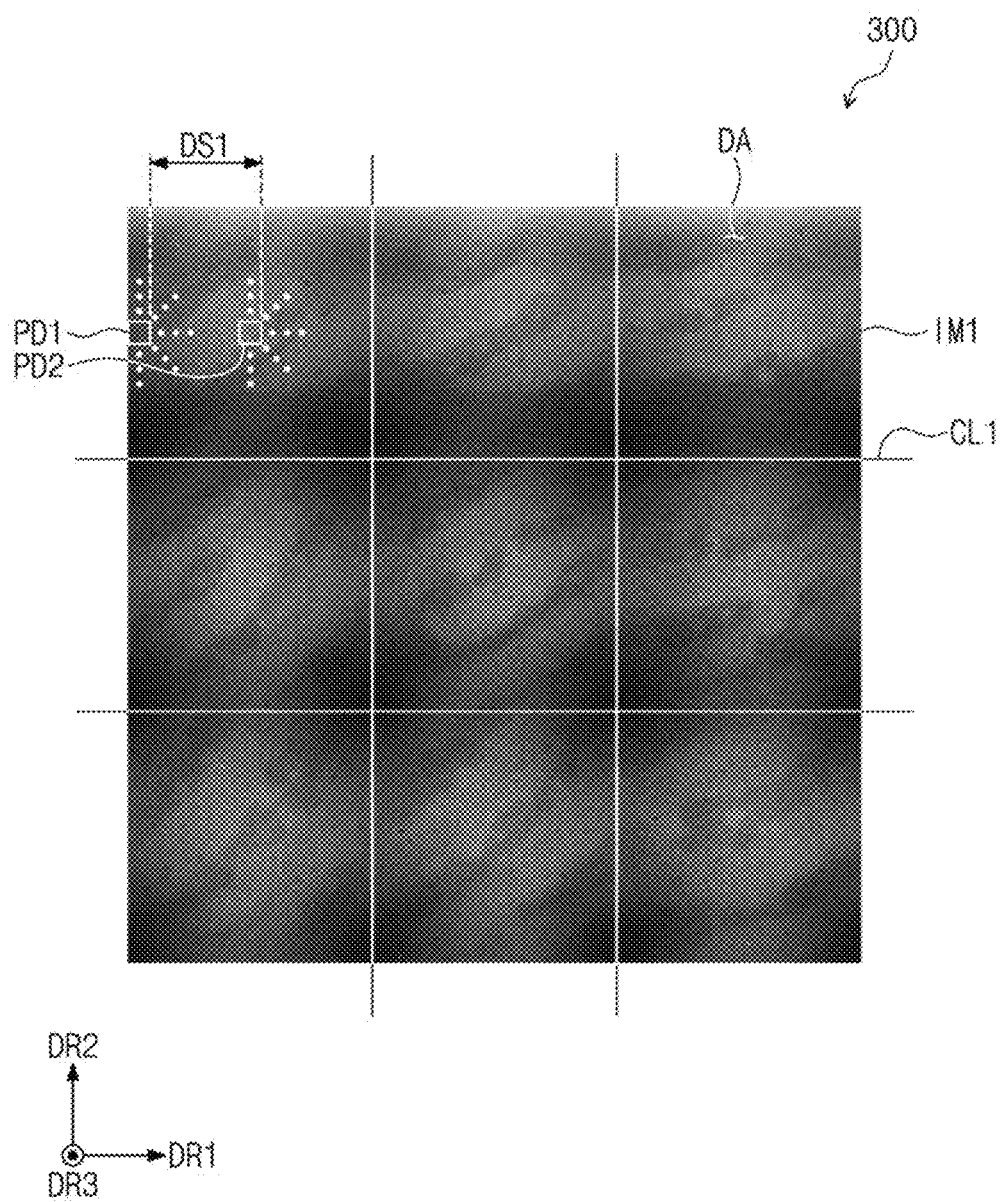
FIG. 6A illustrates a second input sensor and a first image according to an embodiment of the inventive concept.

FIG. 6A illustrates a second input sensor and a first image according to an embodiment of the inventive concept, and FIG. 6B to FIG. 6E illustrate a process of obtaining fingerprint information using a first image according to an embodiment of the inventive concept.

Figure 6B:
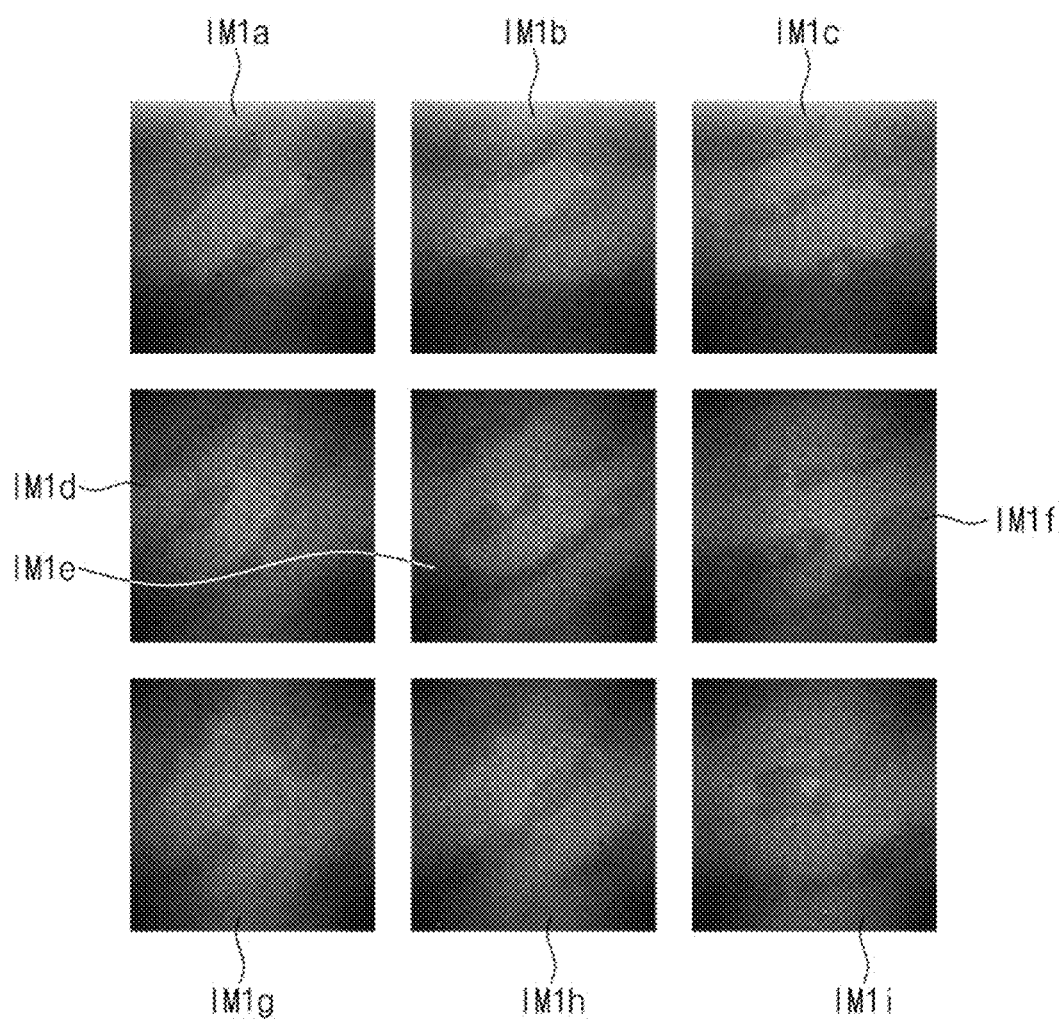
FIG. 6B to FIG. 6E illustrate a process of obtaining fingerprint information using a first image according to an embodiment of the inventive concept.
Figure 6C:
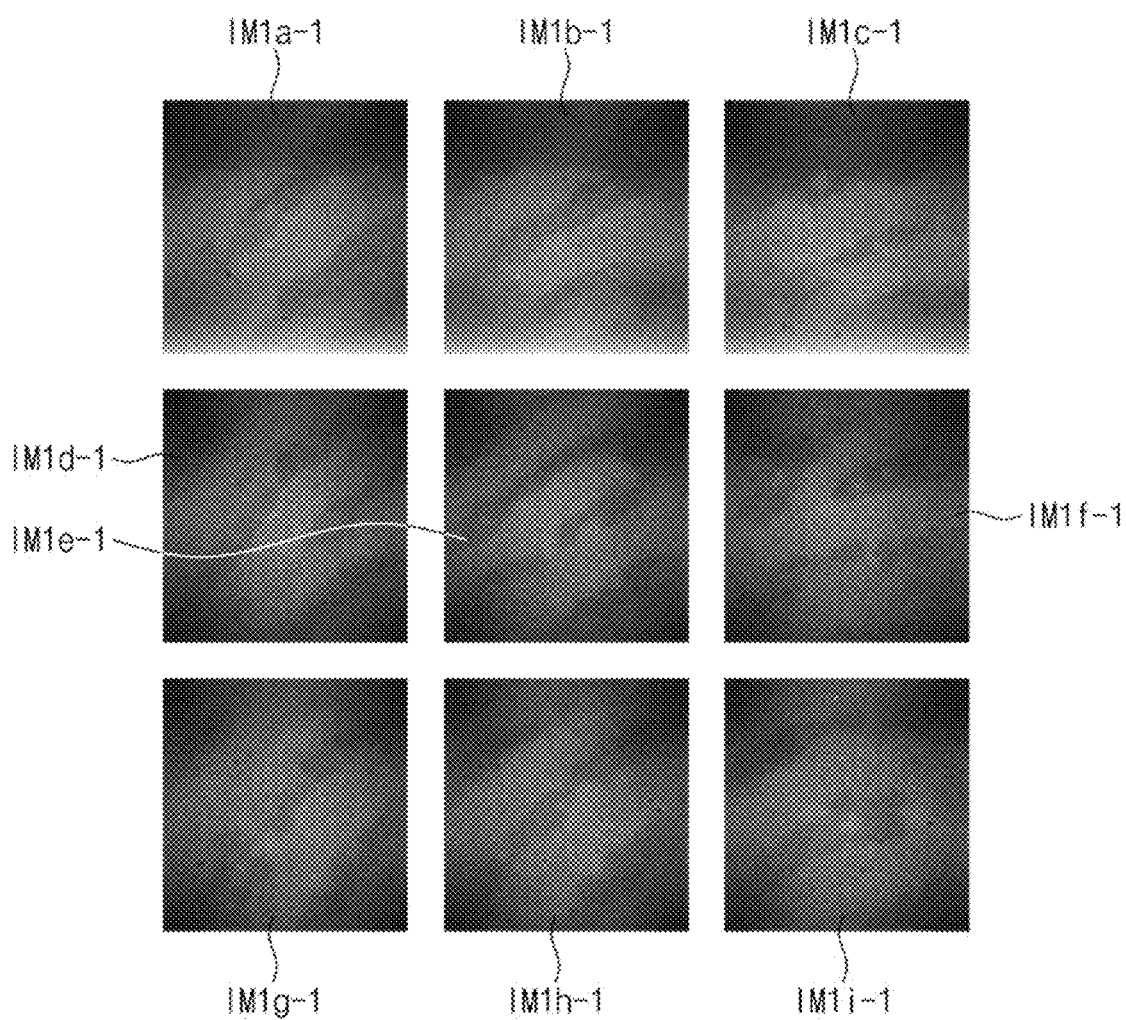
Figure 6D:
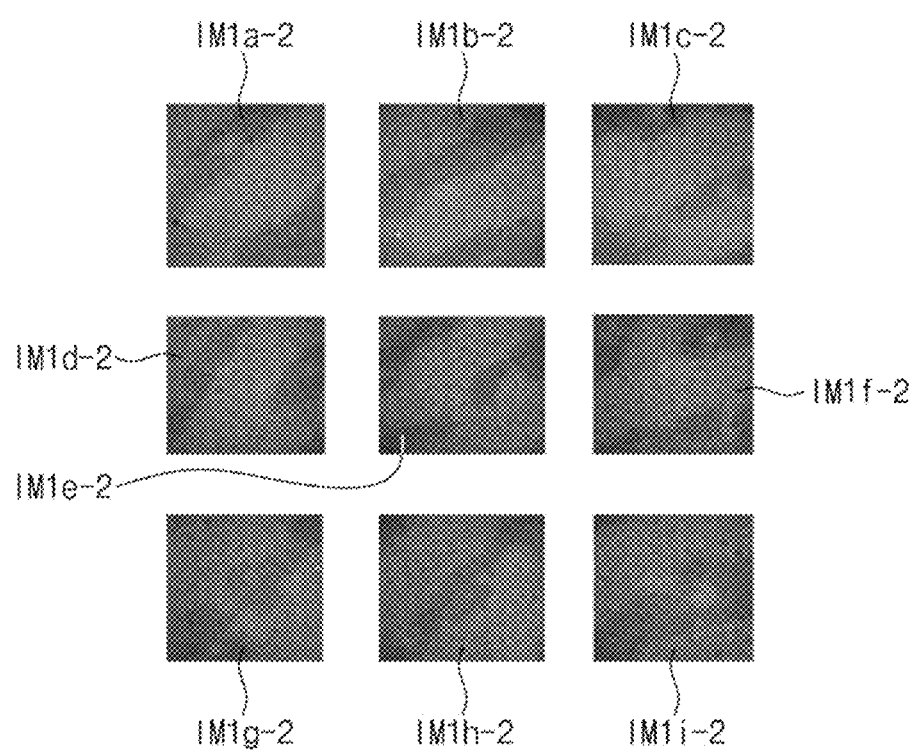
Figure 6E:
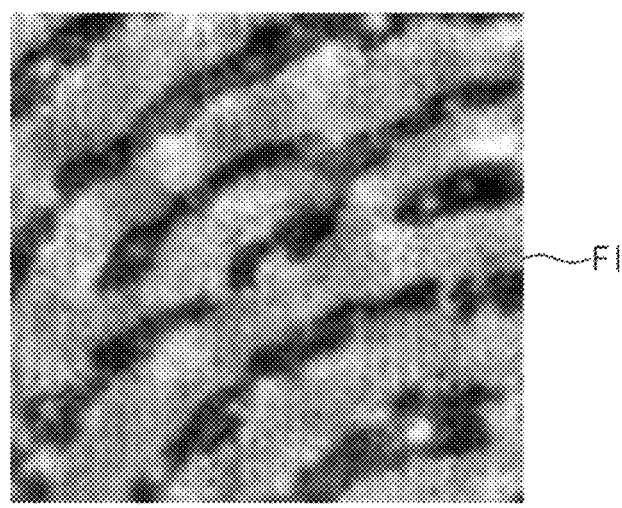

Referring to FIG. 5 to FIG. 6E, according to an embodiment, a first image IM1 is obtained by the second input sensor 300 in a sensing region DA when the display panel 100 is unfolded. The sensing region DA is the sensing region 300-A of FIG. 2. The second input sensor 300 includes a plurality of sensing elements. The plurality of sensing elements are arranged along the first direction DR1 and the second direction DR2. Each of the plurality of sensing elements can sense the second light LT2 shown in FIG. 4, and from the plurality of sensing elements that have sensed the second light LT2, the second input sensor 300 can obtain the first image IM1.

According to an embodiment, the plurality of sensing elements include a first sensing element PD1 and a second sensing element PD2. The first sensing element PD1 is disposed adjacent to an edge of the second input sensor 300. The second sensing element PD2 overlaps an opening HAa of the openings HA shown in FIG. 3A when the display panel 100 is unfolded. The opening HAa is a reference opening. According to an embodiment, the second sensing element PD2 overlap the opening PT shown in FIG. 3B. The opening PT is distinguished from other openings HA by having a different shape from the other openings HA.

According to an embodiment, the second sensing element PD2 has the highest luminance in the portion of the first image IM1 measured through the opening HAa.

According to an embodiment, the first sensing element PD1 and the second sensing element PD2 are spaced apart in the first direction DR1 or the second direction DR2. The first sensing element PD1 and the second sensing element PD2 may be disposed in the same row or in the same column. The separation direction of the first sensing element PD1 and the second sensing element PD2 intersects the folding axis FX shown in FIG. 1A.

According to an embodiment, the distance calculation unit 610 calculates a first distance DS1 between the first sensing element PD1 and the second sensing element PD2 when the display panel 100 is unfolded. The memory unit 650 stores the first distance DS1.

According to an embodiment, the image division unit 620 divides the first image IM1 into a plurality of first sub-images IM1a, IM1b, IM1c, IM1d, IM1e, IM1f, IM1g, IM1h, and IM1i using a first cutting line CL1. The first cutting line CL1 is a reference line for dividing an image, and may be referred to as a first reference line or a first division line. FIG. 6B shows nine sub-images IM1a, IM1b, IM1c, IM1d, IM1e, IM1f, IM1g, IM1h, and IM1i, however, the number of the plurality of sub-images according to an embodiment of the inventive concept is not limited thereto. For example, the number of the plurality of sub-images may be the same as the number of the plurality of openings HA, or may differ from the number of the plurality of openings H.

Referring to FIG. 6C, according to an embodiment, the image rotation unit 630 rotates each of the plurality of sub-images IM1a, IM1b, IM1c, IM1d, IM1e, IM1f, IM1g, IM1h, and IM1i to form a plurality of rotation images IM1a-1, IM1b-1, IM1c-1, IM1d-1, IM1e, IM1f-1, IM1g-1, 1M1h-1, and IM1i-1. For example, the image rotation unit 630 rotates each of the plurality of sub-images IM1a, IM1b, IM1c, IM1d, IM1e, IM1f, IM1g, IM1h, and IM1i by 180°.

According to principles of pinhole imaging, an inverted object image is formed in the second input sensor 300 by the reflected light passed through the plurality of openings HA. The object may be the part of a body FN, and the inverted image includes each of the plurality of sub-images IM1a, IM1b, IM1c, IM1d, IM1e, IM1f, IM1g, IM1h, and IM1i.

According to an embodiment, the image rotation unit 630 obtains an original image by rotating the inverted object images formed by the second light LT2 passing through the plurality of openings HA. The original image is each of the plurality of rotation images IM1a-1, IM1b-1, IM1c-1, IM1d-1, IM1e-1, IM1f-1, IM1g-1, IM1h-1, and IM1i-1.

According to an embodiment, the image combination unit 640 extracts information for obtaining fingerprint information from the plurality of rotation images IM1a-1, IM1b-1, IM1c-1, IM1d-1, IM1e-1, IM1f-1, IM1g-1, IM1h-1, and IM1i-1. Referring to FIG. 6D, the image combination unit 640 extracts a plurality of partial images IM1a-2, IM1b-2, IM1c-2, IM1d-2, IM1e-2, IM1f-2, IM1g-2, IM1h-2, and IM1i-2 from the plurality of rotation images IM1a-1, IM1b-1, IM1c-1, IM1d-1, IM1e-1, IM1f-1, IM1g-1, IM1h-1, and IM1i-1. For example, the image combination unit 640 extracts the information for obtaining fingerprint information by cropping each of the plurality of rotation images IM1a-1, IM1b-1, IM1c-1, IM1d-1, IM1e-1, IM1f-1, IM1g-1, IM1h-1, and IM1i-1 to delete unnecessary image portions.

According to an embodiment, the image combination unit 640 combine the plurality of partial images IM1a-2, IM1b-2, IM1c-2, IM1d-2, IM1e-2, IM1f-2, IM1g-2, IM1h-2, and IM1i-2 to provide a fingerprint image FI, shown in FIG. 6E. For example, the image combination unit 640 converts the plurality of partial images IM1a-2, IM1b-2, IM1c-2, IM1d-2, IM1e-2, IM1f-2, IM1g-2, IM1h-2, and IM1i-2 into the fingerprint image FI through an image processing step.

According to an embodiment, the control unit 600 obtains fingerprint information from the fingerprint image FI.

Figure 7:
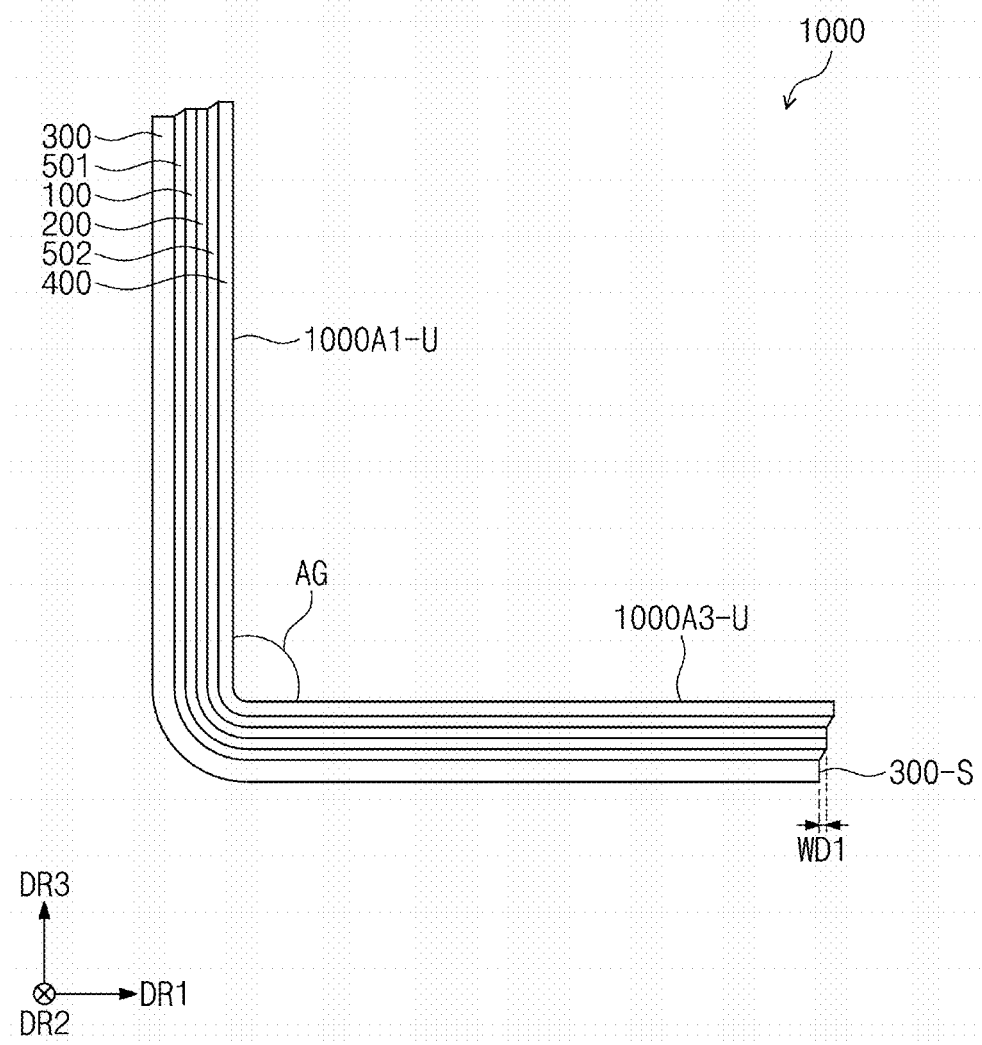
FIG. 7 is a cross-sectional view of a display device according to an embodiment of the inventive concept.
Figure 8:
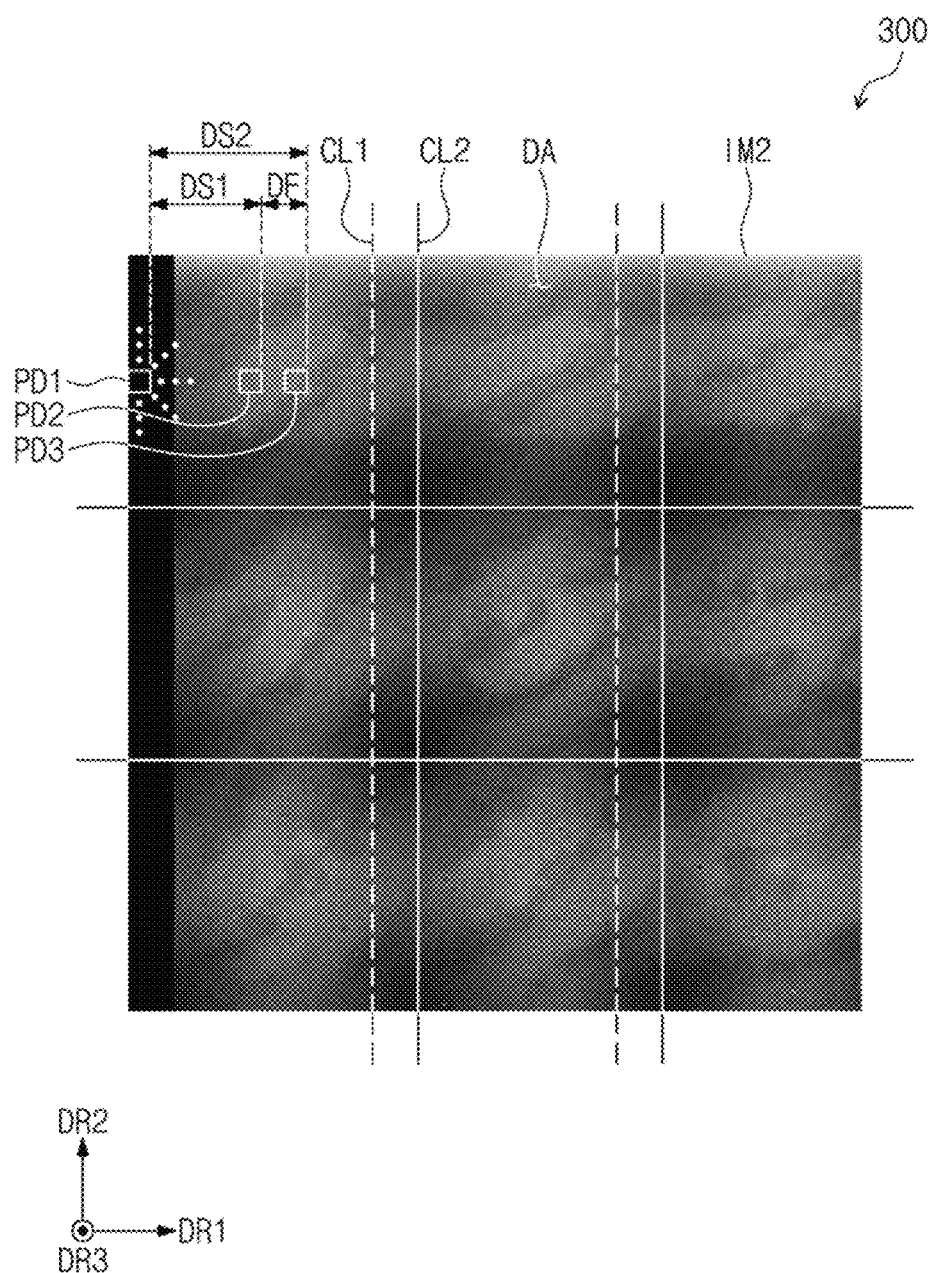
FIG. 8 illustrates a second input sensor and a second image according to an embodiment of the inventive concept.

FIG. 7 is a cross-sectional view of a display device according to an embodiment of the inventive concept, and FIG. 8 illustrates a second input sensor and a second image according to an embodiment of the inventive concept. In describing FIG. 8, the same reference numerals are given to components described with reference to FIG. 6A, and repeated descriptions thereof are omitted.

Referring to FIG. 5, FIG. 7, and FIG. 8, according to an embodiment, the display device 1000 is at least partially folded. An angle AG between an upper surface 1000A of the first region 1000A1 and an upper surface 1000A3-U of the third region 1000A3 is an acute angle and a right angle. FIG. 7 exemplarily illustrates that the angle AG is 90°.

In FIG. 7, according to an embodiment, the display panel 100 is in a second state. The second state refers to a state in which the display panel 100 is at least partially folded. According to an embodiment, the shape of each of the first adhesive layer 501 and the second adhesive layer 502 changes. When the display device 1000 is partially folded, the display panel 100 and the first input sensor 200 protrude by a first protrusion distance WD1 from a side surface 300-S of the second input sensor 300 due to stress applied to the display panel 100 and the first input sensor 200.

According to an embodiment, a second image IM2 is obtained by the second input sensor 300 in the sensing region DA when the display panel 100 is partially folded. The second input sensor 300 includes a plurality of sensing elements.

According to an embodiment, the plurality of sensing elements include a first sensing element PD1, a second sensing element PD2, and a third sensing element PD3, shown in FIG. 8. The second sensing element PD2 overlaps an opening HAa of the openings HA shown in FIG. 3A when the display panel 100 is unfolded. The opening HAa is a reference opening. The third sensing element PD3 overlaps the opening HAa when the display panel 100 is partially folded. However, embodiments are not limited thereto. In other embodiments, the second sensing element PD2 overlaps the opening PT shown in FIG. 3B when the display panel 100 is unfolded, and the third sensing element PD3 overlaps the opening PT when the display panel 100 is partially folded.

According to an embodiment, the third sensing element PD3 has the highest luminance in a portion of the second image IM2 measured through the opening HAa.

According to an embodiment, the distance calculation unit 610 calculates a second distance DS2 between the first sensing element PD1 and the third sensing element PD3 when the display panel 100 is partially folded. The memory unit 650 stores the second distance DS2.

According to an embodiment, the distance calculation unit 610 further calculates a difference value DF between the first distance DS1 of FIG. 6A and the second distance DS2. For example, the difference value DF between the first distance DS1 and the second distance DS2 may be the same as the first protrusion distance WD1. The memory unit 650 stores the difference value DF.

According to an embodiment, the image division unit 620 divides the second image IM2 using a second cutting line CL2 calculated from the difference value DF between the first distance DS1 and the second distance DS2. For example, the second cutting line CL2 is obtained by moving the first cutting line CL1 in the first direction DR1 by the difference value DF.

According to an embodiment, due to stress that occurs when the display device 1000 is partially folded, the alignment between the light blocking layer 110 and the second input sensor 300 is displaced by the first protrusion distance WD1. If the second image IM2 were to be divided by the first cutting line CL1 previously stored, the image division unit 620 divides the second image IM2 when misaligned. In this case, the image combination unit 640 cannot obtain the fingerprint image FI. However, according to embodiments of the inventive concept, the distance calculation unit 610 of the control unit 600 calculates the first distance DS1 between the first sensing element PD1 and the second sensing element PD2 when the display panel 100 is unfolded, and calculates the second distance DS2 between the first sensing element PD1 and the third sensing element PD3 when the display panel 100 is partially folded. The image division unit 620 corrects the second image IM2 obtained from the second input sensor 300 on the basis of the first distance DS1 and the second distance DS2. The control unit 600 obtains fingerprint information by revising the image IM2 obtained when the display device 100 is partially folded. Therefore, the display device 1000 has improved fingerprint recognition performance.

According to an embodiment, the memory unit 650 stores the difference value DF between the first distance DS1 and the second distance DS2 for each angle AG. In a embodiment, the memory unit 650 stores difference values for 18 angles obtained by dividing the angle from no 180° by 10°. However, embodiments are not limited thereto. The number of difference values stored by the memory unit 650 can vary in other embodiments.

According to an embodiment, the display device 1000 calculates the angle AG of the display panel 100 through a hinge, a strain gauge, or a pressure sensor disposed in the second region 1000A2, shown in FIG. 1. The image division unit 620 divides the second image IM2 using a difference corresponding to the calculated angle AG and the angle AG calculated from the plurality of difference values stored in the memory unit 650.

According to embodiments of the inventive concept, the control unit 600 includes the memory unit 650, and the time for processing the second image IM2 to recognize a fingerprint by using the plurality of difference values stored in the memory unit 650 is reduced.

FIG. 9 is a cross-sectional view of a display device according to an embodiment of the inventive concept. In describing FIG. 9, the same reference numerals are given to components described with reference to FIG. 2 and FIG. 7, and repeated descriptions thereof are omitted.

Referring to FIG. 5 and FIG. 9, according to an embodiment, the display device 1000 is substantially completely folded. The upper surface 1000A1-U of the first region 1000A1 and the upper surface 1000A3-U of the third region 1000A3, shown in FIG. 2, face each other. According to an embodiment, when the display device 1000 is completely folded, the display panel 100 and the first input sensor 200 protrude by a second protrusion distance WD2 from the side surface 300-S of the second input sensor 300 due to stress applied to the display panel 100 and the first input sensor 200.

According to an embodiment of the inventive concept, the distance calculation unit 610 of the control unit 600 calculates the first distance DS1 when the display panel 100 is unfolded, and calculates the second distance DS2 (see FIG. 8) when the display panel 100 is completely folded. The image division unit 620 corrects an image obtained by the second input sensor 300 on the basis of a difference value between the first distance and the second distance. The difference value may be the same as the second protrusion distance WD2. The control unit 600 obtains fingerprint information by revising the image obtained when the display device 100 is completely folded state. The control unit 600 corrects the image based on the second protrusion distance WD2. Therefore, the display device 1000 has improved fingerprint recognition performance.

According to embodiments of the inventive concept, a display device includes an input sensor that has a plurality of sensing elements and a control unit. A distance calculation unit of the control unit calculates a first distance between a first sensing element and a second sensing element when the display device is unfolded, and calculates a second distance between the first sensing element and a third sensing element when the display device is folded. An image division unit of the control unit corrects an image obtained from a second input sensor on the basis of the first distance and the second distance. The control unit obtains fingerprint information by revising an image obtained when the display device is folded. Accordingly, the display device has improved fingerprint recognition performance.

Although embodiments of the inventive concept have been described, it will be understood by those skilled in the art that various modifications and changes in form and details may be made therein without departing from the spirit and scope of embodiments of the inventive concept as set forth in the following claims. Accordingly, the technical scope of embodiments of the inventive concept are not intended to be limited to the contents set forth in the detailed description of the specification, but is intended to be defined by the appended claims.

What is claimed is:

1. A display device, comprising:
    a display panel that is divided into a folding region and a non-folding region and that includes a display element layer above a light blocking layer, wherein the light blocking layer includes an opening formed therein;
    an input sensor disposed under the light blocking layer of the display panel, wherein the input sensor overlaps the non-folding region and includes a first sensing element, a second sensing element, and a third sensing element; and
    a control unit that
        calculates a first distance between the first sensing element and the second sensing element when the display panel is in a first state and the second sensing element overlaps the opening,
        calculates a second distance between the first sensing element and the third sensing element when the display device is in a second state that differs from that of the first state and the third sensing element overlaps the opening, and
        corrects an image obtained from the input sensor based on the first distance and the second distance.

2. The display device of claim 1, wherein the first sensing element is disposed adjacent to an edge of the input sensor.

3. The display device of claim 1, wherein the first state is when the display panel is unfolded, the second state is when the display panel is folded, and the image is obtained by the input sensor in the second state.

4. The display device of claim 1, wherein a plurality of holes are further formed in the light blocking layer, and the plurality of holes and the opening have a same shape.

5. The display device of claim 1, wherein a plurality of holes are further formed in the light blocking layer, and the opening has a shape that differs from a shape of each of the plurality of holes.

6. The display device of claim 1, wherein the first sensing element, the second sensing element, and the third sensing element are spaced apart in a first direction.

7. The display device of claim 1, wherein the control unit
    divides the image into a plurality of sub-images based on a difference between the first distance and the second distance,
    rotates each of the plurality of sub-images into a plurality of rotated sub-images, respectively,
    combines the plurality of rotated sub-images, and
    provides a fingerprint image.

8. The display device of claim 1, wherein the control unit stores a difference between the first distance and the second distance, and divides the image into a plurality of sub-images using the difference when the display panel is in the second state.

9. The display device of claim 1, wherein the control unit
    divides the image into a plurality of sub-images using a cutting line calculated based on a difference between the first distance and the second distance, and
    obtains fingerprint information when the display panel is in the second state.

10. A display device, comprising:
    a display panel that includes a display element layer, and a light blocking layer disposed under the display element layer and that includes an opening formed therein, wherein the display panel is divided into a folding region and a non-folding region;
    an input sensor disposed under the non-folding region of the display panel and that includes a plurality of sensing elements; and
    a control unit that
        divides a first image obtained from the input sensor into a plurality of first sub-images using a first cutting line wherein fingerprint information is obtained when the display panel is unfolded, and
        divides a second image obtained from the input sensor into a plurality of second sub-images using a second cutting line in a different position from the first cutting line wherein fingerprint information is obtained when the display panel is folded.

11. The display device of claim 10, wherein the plurality of sensing elements include
    a first sensing element disposed adjacent to an edge of the input sensor,
    a second sensing element that overlaps the opening when the display panel is unfolded, and
    a third sensing element that overlaps the opening when the display panel is folded.

12. The display device of claim 11, wherein the first sensing element, the second sensing element, and the third sensing element are spaced apart in a first direction.

13. The display device of claim 11, wherein the control unit
    calculates a first distance between the first sensing element and the second sensing element, and
    calculates a second distance between the first sensing element and the third sensing element.

14. The display device of claim 13, wherein the second cutting line is obtained by moving the first cutting line by a distance that corresponds to a difference value between the first distance and the second distance.

15. The display device of claim 14, wherein the control unit
    stores the difference value,
    determines the second cutting line using the difference when the display panel is folded, and
    divides the second image based on the second cutting line.

16. The display device of claim 10, wherein the control unit
    rotates each of the plurality of second sub-images,
    combines the plurality of rotated second sub-images into a fingerprint image, and
    provides the fingerprint image.

17. The display device of claim 10, wherein
a plurality of holes are formed in the light blocking layer, and
the plurality of holes and the opening have a same shape.

18. The display device of claim 10, wherein
a plurality of holes are formed in the light blocking layer, and
the opening has a shape that differs from a shape of each of the plurality of holes.

19. A display device, comprising:
a display panel that is divided into a folding region and a non-folding region and includes a light blocking layer that includes a plurality of openings;
an input sensor disposed under the non-folding region of the display panel, wherein the input sensor includes a first sensing element, a second sensing element that overlaps an opening of the plurality of openings when the display panel is unfolded, and a third sensing element that overlaps the opening of the plurality of openings when the display panel is partially folded; and
a control unit that includes a distance calculation unit, an image division unit, an image rotation unit and an image combination unit,
wherein when a first image is obtained by the input sensor when the display panel is unfolded,
the distance calculation unit calculates a first distance between the first sensing element and the second sensing element,
the image division unit divides the first image into a plurality of first sub-images using a first cutting line,
the image rotation unit rotates each of the plurality of sub-images to form a plurality of rotation images, and
the image combination unit extracts information for obtaining a fingerprint by deleting unnecessary image portions from the plurality of rotation images, forms a plurality of partial images and combines the plurality of partial images into a fingerprint image.

20. The display device of claim 19, wherein
when a second image is obtained by the input sensor when the display panel is at least partially folded,
the distance calculation unit calculates a second distance between the first sensing element and the third sensing element and a difference value between the first distance and the second distance, and
the image division unit divides the second image using a second cutting line calculated from the difference value between the first distance and the second distance.

* * * * *